United States Patent
Rofougaran

(10) Patent No.: US 7,859,359 B2
(45) Date of Patent: Dec. 28, 2010

(54) METHOD AND SYSTEM FOR A BALUN EMBEDDED IN AN INTEGRATED CIRCUIT PACKAGE

(75) Inventor: Ahmadreza Rofougaran, Newport Coast, CA (US)

(73) Assignee: Broadcom Corporation, Irvine, CA (US)

( * ) Notice: Subject to any disclaimer, the term of this patent is extended or adjusted under 35 U.S.C. 154(b) by 55 days.

(21) Appl. No.: 12/036,527

(22) Filed: Feb. 25, 2008

(65) Prior Publication Data

US 2009/0212879 A1    Aug. 27, 2009

(51) Int. Cl.
*H01P 1/10* (2006.01)
*H01P 5/10* (2006.01)
*H03H 7/42* (2006.01)

(52) U.S. Cl. .................................. 333/25; 333/101
(58) Field of Classification Search ................ 333/109, 333/110, 111, 112, 115, 116, 25, 26, 101
See application file for complete search history.

(56) References Cited

U.S. PATENT DOCUMENTS

| | | | |
|---|---|---|---|
| 5,914,873 A | 6/1999 | Blish, II | |
| 6,009,314 A * | 12/1999 | Bjork et al. | ............... 455/83 |
| 6,462,976 B1 | 10/2002 | Olejniczak et al. | |
| 6,570,442 B2 | 5/2003 | Nakai et al. | |
| 6,590,468 B2 | 7/2003 | du Toit et al. | |
| 6,848,178 B2 | 2/2005 | Kondo et al. | |
| 7,045,440 B2 | 5/2006 | Huff et al. | |
| 7,084,715 B2 | 8/2006 | Al-Taei et al. | |
| 7,138,884 B2 | 11/2006 | Cheung et al. | |
| 7,149,496 B2 | 12/2006 | Horiuchi et al. | |
| 7,183,633 B2 | 2/2007 | Daneman et al. | |
| 7,289,008 B2 | 10/2007 | Kuroki et al. | |
| 7,336,232 B1 | 2/2008 | Lee et al. | |
| 7,348,842 B2 * | 3/2008 | Ichitsubo et al. | ............... 330/66 |
| 7,349,717 B2 * | 3/2008 | Block et al. | ............. 455/552.1 |
| 7,427,977 B2 | 9/2008 | Park et al. | |
| 7,515,879 B2 | 4/2009 | Okabe et al. | |
| 7,518,248 B2 | 4/2009 | Li et al. | |
| 2002/0039026 A1 | 4/2002 | Stroth et al. | |
| 2002/0180063 A1 | 12/2002 | Iwaki et al. | |
| 2004/0222506 A1 | 11/2004 | Wei et al. | |
| 2005/0023656 A1 | 2/2005 | Leedy | |
| 2005/0161753 A1 | 7/2005 | Huff et al. | |
| 2005/0212642 A1 | 9/2005 | Pleskach et al. | |
| 2005/0270135 A1 | 12/2005 | Chua et al. | |
| 2006/0091958 A1 | 5/2006 | Bhatti et al. | |
| 2006/0152911 A1 | 7/2006 | Humbert et al. | |

(Continued)

*Primary Examiner*—Dean O Takaoka
(74) *Attorney, Agent, or Firm*—McAndrews, Held & Malloy, Ltd.

(57) ABSTRACT

Methods and systems for a balun embedded in an integrated circuit package are disclosed and may include a multi-layer package bonded to an integrated circuit. The multi-layer package may include an integrated balun which may be enabled to process RF signals received from and/or communicated to an antenna. The integrated circuit may be flip-chip bonded to the multi-layer package. The balun may include ferromagnetic layers integrated in the multi-layer package, and may be bypassed via bypass switches integrated in the multi-layer package. The switches integrated in the multi-layer package may include MEMS switches. The balun may be bypassed via bypass switches in the integrated circuit. The switches in the integrated circuit may include CMOS switches. The balun may be impedance matched to the integrated circuit via surface mount devices, which may be coupled to the multi-layer package.

68 Claims, 5 Drawing Sheets

U.S. PATENT DOCUMENTS

2007/0062027 A1    3/2007   Ripamonti et al.
2008/0197963 A1*   8/2008   Muto .......................... 336/200
2009/0127674 A1    5/2009   Suzuki
2009/0189064 A1    7/2009   Miller et al.
2009/0243535 A1    10/2009  Erdmann et al.

* cited by examiner

METHOD AND SYSTEM FOR A BALUN EMBEDDED IN AN INTEGRATED CIRCUIT PACKAGE

CROSS-REFERENCE TO RELATED APPLICATIONS/INCORPORATION BY REFERENCE

[Not Applicable]

FEDERALLY SPONSORED RESEARCH OR DEVELOPMENT

[Not Applicable]

MICROFICHE/COPYRIGHT REFERENCE

[Not Applicable]

FIELD OF THE INVENTION

Certain embodiments of the invention relate to wireless communication. More specifically, certain embodiments of the invention relate to a method and system for a balun embedded in an integrated circuit package.

BACKGROUND OF THE INVENTION

Mobile communications have changed the way people communicate and mobile phones have been transformed from a luxury item to an essential part of every day life. The use of mobile phones is today dictated by social situations, rather than hampered by location or technology. While voice connections fulfill the basic need to communicate, and mobile voice connections continue to filter even further into the fabric of every day life, the mobile Internet is the next step in the mobile communication revolution. The mobile Internet is poised to become a common source of everyday information, and easy, versatile mobile access to this data will be taken for granted.

As the number of electronic devices enabled for wireline and/or mobile communications continues to increase, significant efforts exist with regard to making such devices more power efficient. For example, a large percentage of communications devices are mobile wireless devices and thus often operate on battery power. Additionally, transmit and/or receive circuitry within such mobile wireless devices often account for a significant portion of the power consumed within these devices. Moreover, in some conventional communication systems, transmitters and/or receivers are often power inefficient in comparison to other blocks of the portable communication devices. Accordingly, these transmitters and/or receivers have a significant impact on battery life for these mobile wireless devices.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for a balun embedded in an integrated circuit package, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain aspects of the invention may be found in a method and system for a balun embedded in an integrated circuit package. Exemplary aspects of the invention may comprise coupling an RF signal between an integrated circuit and an antenna via a balun integrated in a multi-layer package coupled to the integrated circuit. The integrated circuit may be flip-chip bonded to the multi-layer package. The balun may comprise ferromagnetic layers integrated in the multi-layer package, and may be bypassed via bypass switches integrated in the multi-layer package. The switches integrated in the multi-layer package may comprise MEMS switches. The balun may be bypassed via bypass switches in the integrated circuit. The switches in the integrated circuit may comprise CMOS switches. The balun may be impedance matched to the integrated circuit via surface mount devices, which may be coupled to the multi-layer package.

Figure 1:
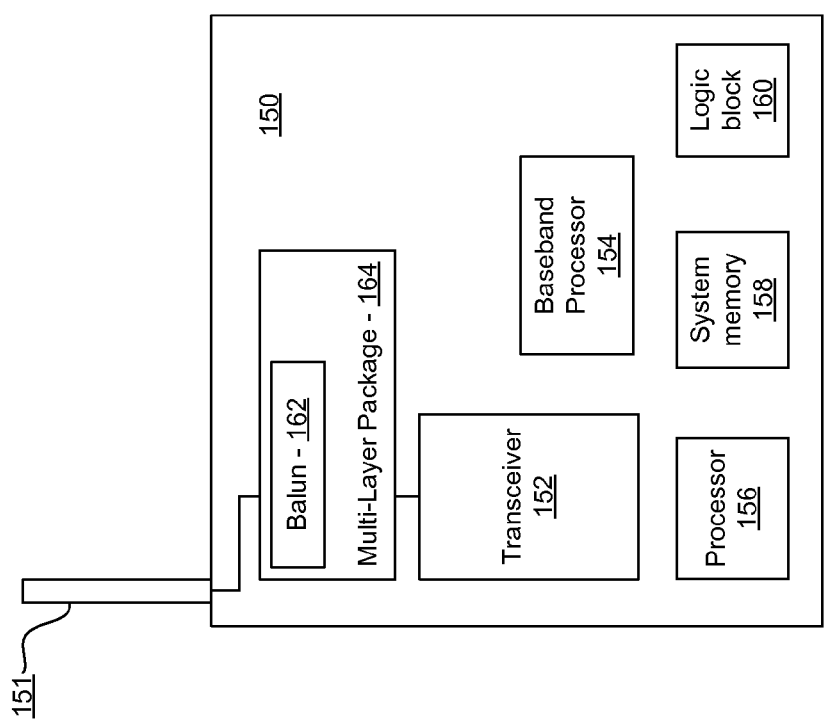
FIG. 1 is a block diagram of an exemplary wireless system, which may be utilized in accordance with an embodiment of the invention.

FIG. 1 is a block diagram of an exemplary wireless system, which may be utilized in accordance with an embodiment of the invention. Referring to FIG. 1, the wireless system 150 may comprise an antenna 151, a transceiver 152, a baseband processor 154, a processor 156, a system memory 158, a logic block 160, a multi-layer package 164, and a balun 162. The antenna 151 may be used for reception and/or transmission of RF signals.

The transceiver 152 may comprise suitable logic, circuitry, and/or code that may be enabled to modulate and upconvert baseband signals to RF signals for transmission by one or more antennas, which may be represented generically by the antenna 151. The transceiver 152 may also be enabled to downconvert and demodulate received RF signals to baseband signals. The RF signals may be received by one or more antennas, which may be represented generically by the antenna 151. Different wireless systems may use different antennas for transmission and reception. The transceiver 152 may be enabled to execute other functions, for example, filtering the baseband and/or RF signals, and/or amplifying the baseband and/or RF signals. Although a single transceiver 152 is shown, the invention is not so limited. Accordingly, the transceiver 152 may be implemented as a separate transmitter and a separate receiver. In addition, there may be a plurality of transceivers, transmitters and/or receivers. In this regard, the plurality of transceivers, transmitters and/or receivers may enable the wireless system 150 to handle a plurality of wireless protocols and/or standards including cellular, WLAN and PAN.

The balun 162 may comprise suitable circuitry, logic, and/or code that may enable converting balanced RF signals from the transceiver 152 to unbalanced RF signals, such that they may be transmitted by the antenna 151. The balun 162 may be coupled between the transceiver 152 and the antenna 151, and may be integrated in the multi-layer package 164.

The multi-layer package 164 may comprise multiple layers of insulating and conductive material for integrating multiple devices within the package. The multi-layer package 164 may enable the coupling of multiple devices to an integrated circuit, as described with respect to FIG. 4.

In an embodiment of the invention, the transceiver 152 may be coupled to the antenna via a balun 162 that may be integrated in the multi-layer package 164 comprising magnetic layers deposited on the top, bottom and/or embedded within the multi-layer package 164. A balun may enable the coupling of balanced signals from the differential output of a power amplifier in the transceiver 152, to an unbalanced signal at the antenna 151, as described with respect to FIG. 2. By integrating one or more baluns on an integrated circuit package, such as the multi-layer package 164, high performance devices may be utilized while reducing volume requirements.

The magnetic layers may comprise ferromagnetic and/or ferrimagnetic layers. In this manner, high inductance values may be obtained for devices such as transformers, inductors, and baluns. By utilizing ferromagnetic materials resulting in higher inductances than conventional discrete devices, the size of these devices may be greatly reduced, which may be increasingly important as the frequency of operation of the wireless system 150 may be extended to the 60 GHz range.

The ferrimagnetic material may be anisotropic, such that a magnetic field may align the magnetic dipoles in the material to produce a net (nonzero) dipole moment, which may cause the dipoles to precess at a frequency controlled by the strength of the magnetic field. A signal circularly polarized in the same direction as the precession may interact strongly with the dipole moments, while a signal circularly polarized in the opposite direction of the precession may interact weakly. Thus, signals may propagate through the ferrimagnetic material differently, depending on the direction of travel, which may be exploited to fabricate directional devices such as isolators, circulators, and gyrators. In addition, by controlling the magnetic field, the interaction with signals traveling through the ferrite may be altered, and this may be exploited to fabricate exemplary devices such as phase shifters, switches, and tunable resonators and/or filters.

The baseband processor 154 may comprise suitable logic, circuitry, and/or code that may be enabled to process baseband signals for transmission via the transceiver 152 and/or the baseband signals received from the transceiver 152. The processor 156 may comprise any suitable processor or controller such as a CPU or DSP, or any type of integrated circuit processor. The processor 156 may comprise suitable logic, circuitry, and/or code that may be enabled to control the operations of the transceiver 152 and/or the baseband processor 154. For example, the processor 156 may be utilized to update and/or modify programmable parameters and/or values in a plurality of components, devices, and/or processing elements in the transceiver 152 and/or the baseband processor 154. At least a portion of the programmable parameters may be stored in the system memory 158.

Control and/or data information, which may comprise programmable parameters, may be transferred from other portions of the wireless system 150, not shown in FIG. 1, to the processor 156. Similarly, the processor 156 may be enabled to transfer control and/or data information, which may include the programmable parameters, to other portions of the wireless system 150, not shown in FIG. 1, which may be part of the wireless system 150.

The processor 156 may utilize the received control and/or data information, which may comprise the programmable parameters, to determine an operating mode of the transceiver 152. For example, the processor 156 may be utilized to select a specific frequency for a local oscillator, a specific gain for a variable gain amplifier, configure the local oscillator and/or configure the variable gain amplifier for operation in accordance with various embodiments of the invention. Moreover, the specific frequency selected and/or parameters needed to calculate the specific frequency, and/or the specific gain value and/or the parameters, which may be utilized to calculate the specific gain, may be stored in the system memory 158 via the processor 156, for example. The information stored in system memory 158 may be transferred to the transceiver 152 from the system memory 158 via the processor 156.

The system memory 158 may comprise suitable logic, circuitry, and/or code that may be enabled to store a plurality of control and/or data information, including parameters needed to calculate frequencies and/or gain, and/or the frequency value and/or gain value. The system memory 158 may store at least a portion of the programmable parameters that may be manipulated by the processor 156.

The logic block 160 may comprise suitable logic, circuitry, and/or code that may enable controlling of various functionalities of the wireless system 150. For example, the logic block 160 may comprise one or more state machines that may generate signals to control the transceiver 152 and/or the baseband processor 154. The logic block 160 may also comprise registers that may hold data for controlling, for example, the transceiver 152 and/or the baseband processor 154. The logic block 160 may also generate and/or store status information that may be read by, for example, the processor 156. Amplifier gains and/or filtering characteristics, for example, may be controlled by the logic block 160.

Figure 2:
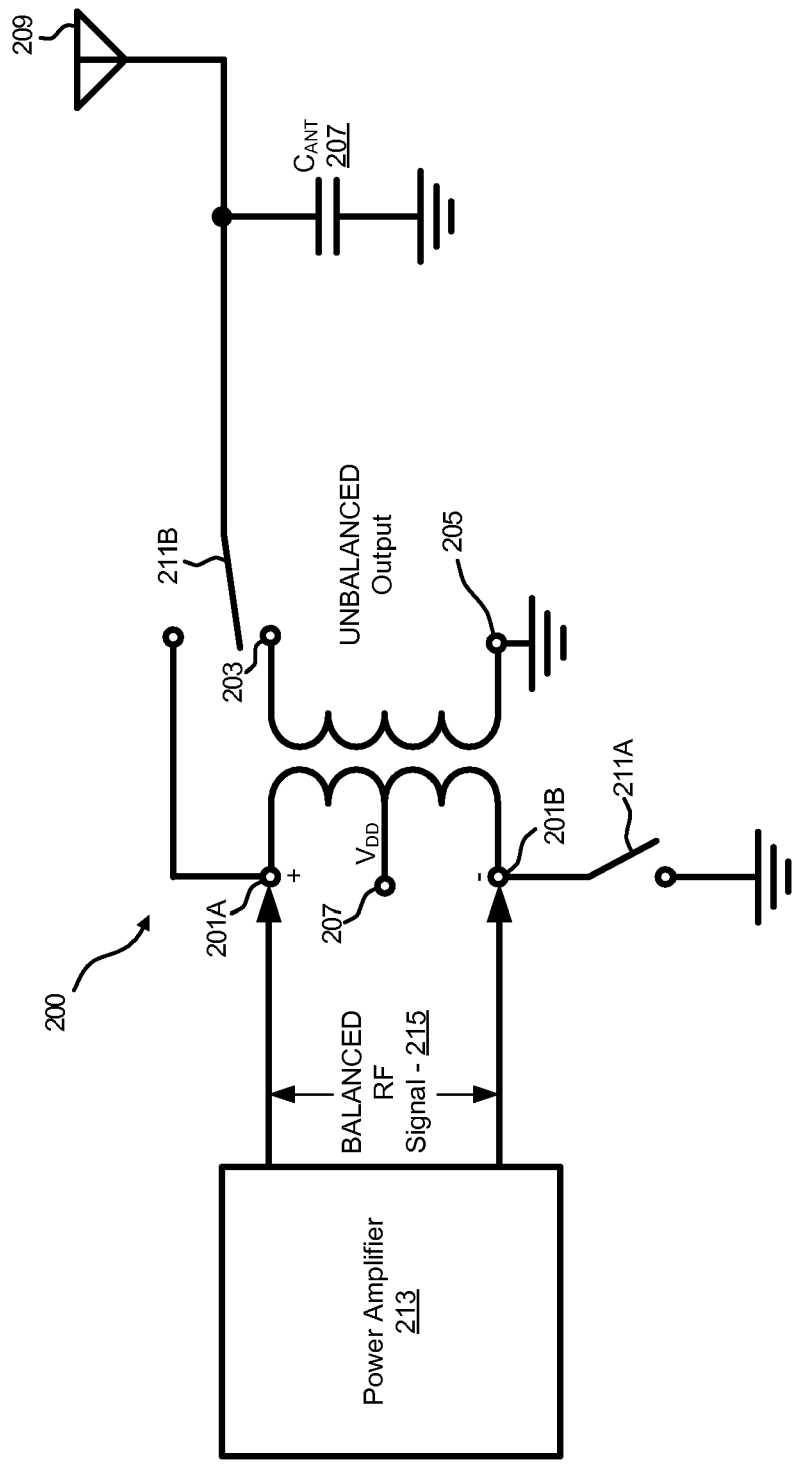
FIG. 2 is a block diagram of an exemplary balun transformer, in accordance with an embodiment of the invention.

FIG. 2 is a block diagram of an exemplary balun transformer, in accordance with an embodiment of the invention. Referring to FIG. 2, there is shown a balun transformer 200, an antenna capacitor 207, an antenna 209, switches 211A and 211B, and a power amplifier (PA) 213. There is also shown a balanced RF input signal 215. The balun transformer 200 may comprise + and − balanced inputs 201A and 201B, a DC bias tap 207, an unbalanced output 203 and a ground output 205. The antenna 209 may be substantially similar to the antenna 151, described with respect to FIG. 1.

The antenna capacitor 207 may enable improved impedance matching between the antenna 209 and the output impedance of the PA 213. The switches 211A and 211B may comprise microelectromechanical system (MEMS) switches or CMOS transistor switches on an integrated circuit, for example.

The PA 213 may comprise suitable circuitry, logic and/or code that may amplify an RF signal that may be communicated to the antenna 209 via the balun 200. The PA 213, which may be within the transceiver 152 described with respect to FIG. 1, may generate a balanced RF signal, the balanced RF input signal 215. In another embodiment of the invention, the balun 200 may be electrically coupled to a low noise amplifier, as opposed to the PA 213, for processing signals received by the antenna 209.

In operation, an RF signal to be transmitted by the antenna 209 may be communicated from a differential output power amplifier, the PA 213, to the balanced inputs 201A and 201B of the balun 200. The unbalanced output signal may be communicated to the antenna 209 for transmission. In an embodiment of the invention, the antenna capacitor 207 may be configurable to adjust the impedance matching for different frequencies or different antennas in instances where more than one antenna may be utilized.

The switches 211A and 211B may enable switching the balun 200 in or out of the circuit path between the balanced RF input signal 215 and the antenna 209. In instances where an unbalanced output signal may be received from the power amplifier 213, the switch 211A may be closed and the switch 211B may be switched to the lead coupled to the + balanced input 201A instead of the unbalanced output 203. This may effectively shunt the received signal around the balun 200.

Figure 3:
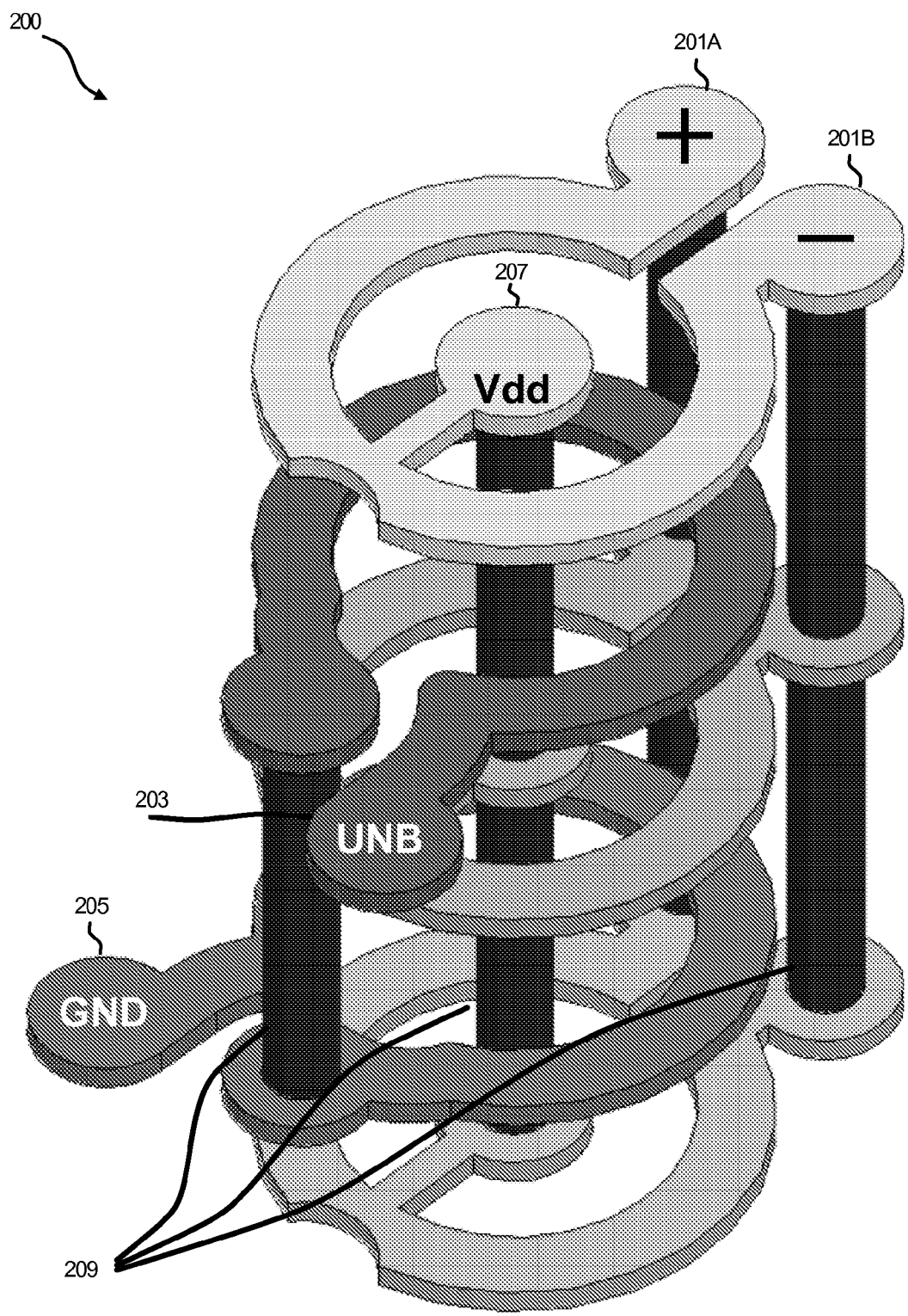
FIG. 3 is a block diagram illustrating an exemplary multi-layer balun, in accordance with an embodiment of the invention.

FIG. 3 is a block diagram illustrating an exemplary multi-layer balun, in accordance with an embodiment of the invention. Referring to FIG. 3, there is shown the balun 200 comprising a plurality of metal layers arranged in a vertical stack. In an embodiment of the invention, the stacked metal layers may comprise ferromagnetic materials and may be separated by insulating material, as described further with respect to FIG. 4. The + and − balanced inputs 201A and 201B, the DC bias tap 207, the unbalanced output 203, and the ground output 205 may be as described with respect to FIG. 2.

In an embodiment of the invention, the balun 200 may be integrated into an integrated circuit package and may be coupled to a power amplifier in an integrated circuit and an antenna via wire bonds. In another embodiment of the invention, the integrated circuit may be coupled to the package via a flip-chip bonding technique to reduce stray impedances, and is described further with respect to FIG. 4.

In operation, an RF signal to be transmitted may be communicated from a differential output power amplifier, such as the PA 213 described with respect to FIG. 2, to the balanced inputs 201A and 201B of the balun 200. The unbalanced output signal may be communicated to an antenna, such as the antenna 209, described with respect to FIG. 2, for transmission. The input and output signals may be communicated to and from the balun 200 via bump-bonds to reduce stray capacitance.

Figure 4:
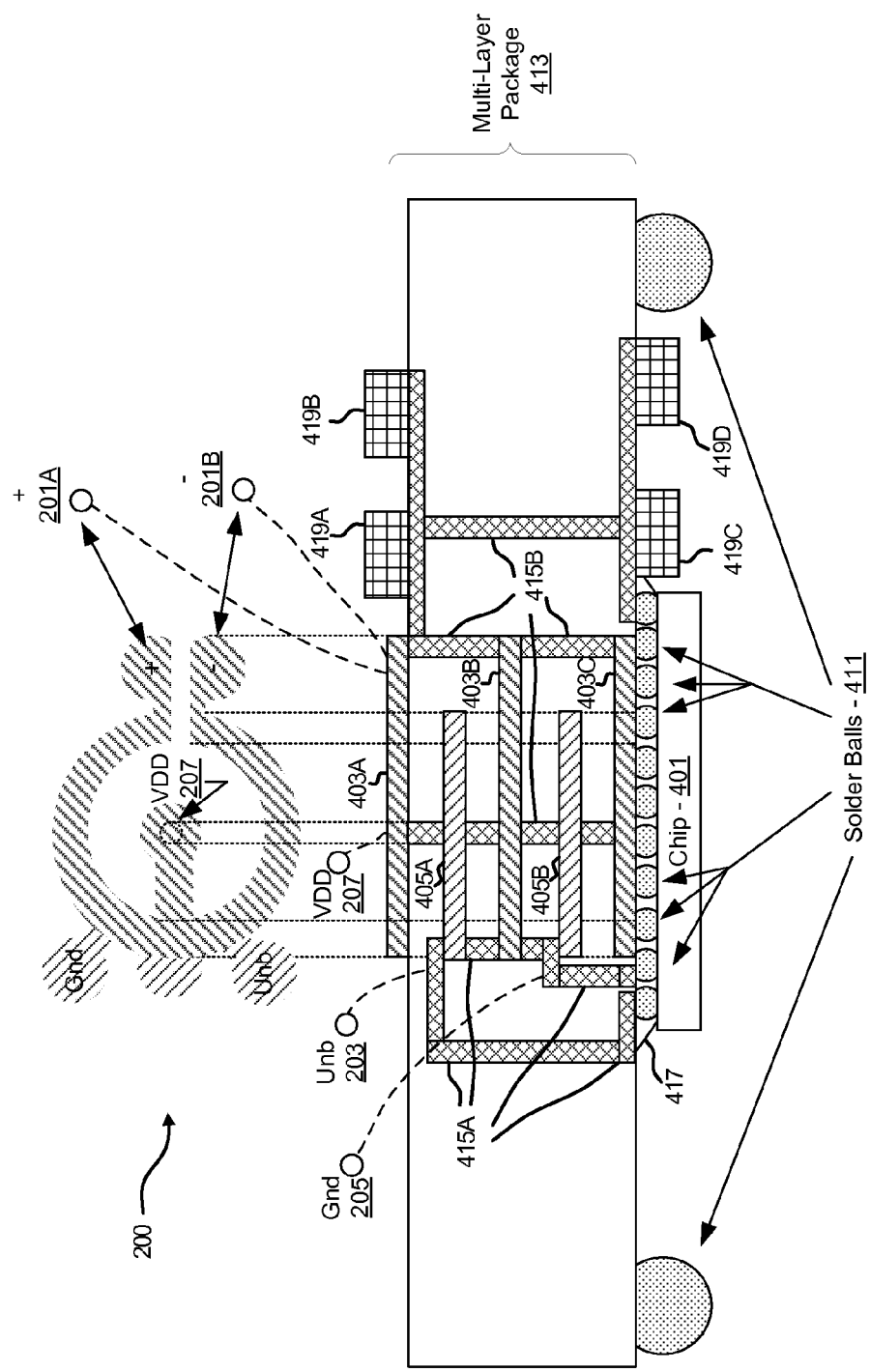
FIG. 4 is a block diagram illustrating a cross-sectional view of a multi-layer package with an integrated balun, in accordance with an embodiment of the invention.

FIG. 4 is a block diagram illustrating a cross-sectional view of a multi-layer package with an integrated balun, in accordance with an embodiment of the invention. Referring to FIG. 4, there is shown a chip 401, magnetic layers 403A, 403B, 403C, 405A and 405B, solder balls 411, a multi-layer package 413, metal interconnects 415A and 415B, surface mount components 419A, 419B, 419C, and 419D, and thermal epoxy 417. There is also shown the + and − balanced inputs 201A and 201B, the unbalanced output 203, the ground output 205, and the DC bias tap 207, described with respect to FIGS. 2 and 3.

The chip 401, or integrated circuit, may comprise the transceiver 152 described with respect to FIG. 1, and/or any other integrated circuit within the wireless system 150 that may require inductive components and/or devices. The chip 401 may be bump-bonded or flip-chip bonded to the multi-layer package 413 utilizing the solder balls 411. In this manner, wire bonds coupling the chip 401 to the multi-layer package 413 may be eliminated, reducing and/or eliminating uncontrollable stray inductances due to wire bonds. In addition, the thermal conductance out of the chip 401 may be greatly improved utilizing the solder balls 211 and the thermal epoxy 417. The thermal epoxy 417 may be electrically insulating but thermally conductive to allow for thermal energy to be conducted out of the chip 401 to the much larger thermal mass of the multilayer package 413.

The magnetic layers 403A, 403B, 403C, 405A and 405B may comprise ferromagnetic and/or ferrimagnetic layers utilized to define magnetic devices such as transformers, inductors, baluns, isolators, circulators, and gyrators. The magnetic materials may be deposited on the top, bottom and/or embedded within the multi-layer package 413. The magnetic layers 403A, 403B, 403C, 405A and 405B may comprise the inductive layers of the balun 200.

The solder balls 411 may comprise spherical balls of metal to provide electrical, thermal and physical contact between the chip 401 and the multi-layer package 413. In making the contact with the solder balls 411, the chip may be pressed with enough force to squash the metal spheres somewhat, and may be performed at an elevated temperature to provide suitable electrical resistance and physical bond strength. The solder balls 411 may also be utilized to provide electrical, thermal and physical contact between the multi-layer package 413 and a printed circuit board comprising other parts of the wireless system 150, described with respect to FIG. 1.

The metal interconnects 415A and 415B may comprise metal traces embedded in and/or deposited on the multilayer package 413 that may be utilized as electrically conductive paths in the balun 200 and also from the balun 200 and the surface mount devices 419A, 419B, 419C and 419D to the chip 401 via the solder balls 411. In addition, the metal interconnects 415A and 415B may not be limited to the number of interconnects shown in FIG. 4. Accordingly, there may be any number of interconnects embedded within the multi-layer package 413, depending on the number of contacts on the chip 401 coupled to the solder balls 411, the number of magnetic layers in the balun 200, and the number of magnetic layer and surface mount devices coupled to the multi-layer package 413.

The surface mount devices 419A, 419B, 419C and 419D may comprise discrete circuit elements such as resistors, capacitors, inductors, switches, and diodes, for example. The surface mount devices 419A, 419B, 419C and 419D may be soldered to the multi-layer package 413 to provide electrical contact.

In operation, the chip 401 may comprise an RF front end, such as the RF transceiver 152, described with respect to FIG. 1, and may be utilized to transmit and receive RF signals. The chip 401 may be electrically coupled to the balun 200 comprising the magnetic layers 403A, 403B, 403C, 405A and 405B and the metal interconnects 415A and 415B. Heat from the chip 401 may be conducted to the multi-layer package via the thermal epoxy 417 and the solder balls 411.

The balun 200 may receive balanced RF signals from the chip 401 via the solder balls 411 and the metal traces 415A and 415B and the + and − balanced inputs 201A and 201B. The output signal from the balun 200 may be communicated from the unbalanced output 203 and the ground output 205, and subsequently communicated to an antenna such as the antenna 209, described with respect to FIG. 2. The antenna 209 may be integrated with the multi-layer package 413 or the chip 401, or may be located external to the multi-layer package 413 and the chip 401.

The impedance of the balun 200 may be configured by switching in or out capacitors, resistors, or other inductors comprising the surface mount devices 419A, 419B, 419C and 419D and/or devices within the chip 401. In an embodiment of the invention, the balun 200 may be switched in and out of the circuit via switches, as described with respect to FIG. 2. The switches may comprise the surface mount devices 419A-D, or may be integrated within the chip 401, for example. In another embodiment of the invention, MEMS switches may be integrated into the multi-layer package 413.

Figure 5:
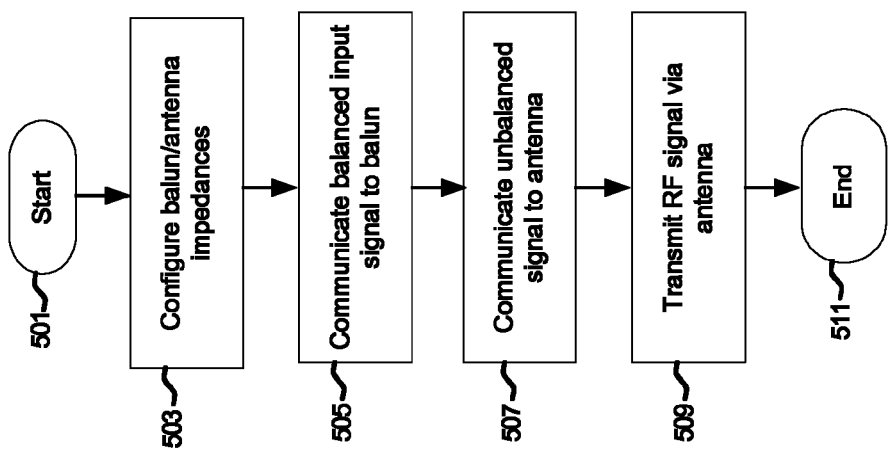
FIG. 5. is a block diagram illustrating exemplary steps in the operation of a balun integrated in a multi-layer package, in accordance with an embodiment of the invention.

FIG. 5. is a block diagram illustrating exemplary steps in the operation of a balun integrated in a multi-layer package, in accordance with an embodiment of the invention. In step 503, after start step 501, the balun impedance may be configured to provide proper impedance matching with an antenna. In step 505, a balanced RF signal may be communicated to the balun followed by step 509, where an unbalanced RF signal may be communicated to an antenna. In step 509, the output RF signal may be transmitted by the antenna, followed by end step 511.

In an embodiment of the invention, a method and system are disclosed for a multi-layer package 413 bonded to an integrated circuit 401. The multi-layer package 413 may include an integrated balun 200 which may be enabled to process RF signals received from and/or communicated to an antenna 209. The integrated circuit 401 may be flip-chip bonded to the multi-layer package 413. The balun 200 may comprise ferromagnetic layers 403A, 403B, 403C, 405A, and 405B integrated in the multi-layer package 413, and may be bypassed via bypass switches 211A and 211B integrated in the multi-layer package 413. The switches 211A and 211B integrated in the multi-layer package 413 may comprise MEMS switches. The balun 200 may be bypassed via bypass switches in the integrated circuit 401. The switches 211A and 211B in the integrated circuit 401 may comprise CMOS switches. The balun 200 may be impedance matched to the integrated circuit 401 via surface mount devices 419A, 419B, 419C, and 419D, which may be coupled to the multi-layer package 413.

In another embodiment of the invention, in an integrated circuit, received RF signals may be received for processing by a balun. The balun may be integrated in a multi-layer package. The integrated circuit maybe bonded to the multi-layer package and the balun may be enabled to receive the RF signals from an antenna. The balun may be electrically coupled to the antenna.

Certain embodiments of the invention may comprise a machine-readable storage having stored thereon, a computer program having at least one code section for wireless communication, the at least one code section being executable by a machine for causing the machine to perform one or more of the steps described herein.

Accordingly, aspects of the invention may be realized in hardware, software, firmware or a combination thereof. The invention may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The present invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for wireless communication, the method comprising:
   processing received RF signals in an integrated circuit electrically coupled to a balun that is integrated in a multi-layer package, wherein:
   said integrated circuit is bonded to said multi-layer package,
   said balun is enabled to process RF signals received from and/or communicated to an antenna,
   said balun comprises ferromagnetic layers integrated in said multi-layer package; and
   said processing of said RF signals by said balun is bypassable via bypass switches integrated in said multi-layer package.

2. The method according to claim 1, wherein said integrated circuit is flip-chip bonded to said multi-layer package.

3. The method according to claim 1, wherein said bypass switches integrated in said multi-layer package comprise MEMS switches.

4. The method according to claim 1, wherein said processing of said RF signals by said balun is bypassable via bypass switches integrated in said integrated circuit.

5. The method according to claim 4, wherein said bypass switches in said integrated circuit comprise CMOS switches.

6. The method according to claim 1, comprising impedance matching said balun to said integrated circuit via surface mount devices.

7. The method according to claim 6, wherein said surface mount devices are coupled to said multi-layer package.

8. The method according to claim 1, wherein said balun is electrically coupled to said antenna.

9. A system for wireless communication, the system comprising:
   a multi-layer package bonded to an integrated circuit, wherein:
   said multi-layer package comprises an integrated balun;
   said balun is enabled to process RF signals received from and/or communicated to an antenna;

said balun comprises ferromagnetic layers integrated in said multi-layer package; and
said processing of said RF signals by said balun is bypassable via bypass switches integrated in said multi-layer package.

10. The system according to claim 9, wherein said integrated circuit is flip-chip bonded to said multi-layer package.

11. The system according to claim 9, wherein said bypass switches integrated in said multi-layer package comprise MEMS switches.

12. The system according to claim 9, wherein said processing of said RF signals by said balun is bypassable via bypass switches integrated in said integrated circuit.

13. The system according to claim 12, wherein said bypass switches in said integrated circuit comprise CMOS switches.

14. The system according to claim 9, wherein said balun is impedance matched to said integrated circuit via surface mount devices.

15. The system according to claim 14, wherein said surface mount devices are coupled to said multi-layer package.

16. The system according to claim 9, wherein said balun is electrically coupled to said antenna.

17. A method for wireless communication, the method comprising:
processing received RF signals in an integrated circuit coupled to a balun integrated in a multi-layer package, wherein:
said integrated circuit is bonded to said multi-layer package;
said balun is enabled to process said received RF signals, which are received from and/or communicated to an antenna; and
bypass switches integrated in said multi-layer package enable bypassing said processing of said received RF signals by said balun.

18. The method according to claim 17, wherein said integrated circuit is flip-chip bonded to said multi-layer package.

19. The method according to claim 17, wherein said bypass switches integrated in said multi-layer package comprise MEMS switches.

20. The method according to claim 17, comprising impedance matching said balun to said integrated circuit via surface mount devices.

21. The method according to claim 20, wherein said surface mount devices are coupled to said multi-layer package.

22. The method according to claim 17, wherein said balun is electrically coupled to said antenna.

23. A system for wireless communication, the system comprising:
a multi-layer package bonded to an integrated circuit, wherein:
said multi-layer package comprises an integrated balun;
said balun is enabled to process RF signals received from and/or communicated to an antenna; and
said integrated circuit bypasses said balun via bypass switches integrated in said multi-layer package.

24. The system according to claim 23, wherein said integrated circuit is flip-chip bonded to said multi-layer package.

25. The system according to claim 23, wherein said bypass switches integrated in said multi-layer package comprise MEMS switches.

26. The system according to claim 23, wherein said balun is impedance matched to said integrated circuit via surface mount devices.

27. The system according to claim 23, wherein said surface mount devices are coupled to said multi-layer package.

28. The system according to claim 23, wherein said balun is electrically coupled to said antenna.

29. A method for wireless communication, the method comprising:
processing received RF signals in an integrated circuit coupled to a balun integrated in a multi-layer package, wherein:
said integrated circuit is bonded to said multi-layer package;
said balun is enabled to process RF signals, which are received from and/or communicated to an antenna; and
bypass switches integrated in said integrated circuit enable bypassing said processing of said processing of said received RF signals by said balun.

30. The method according to claim 29, wherein said integrated circuit is flip-chip bonded to said multi-layer package.

31. The method according to claim 29, wherein said switches in said integrated circuit comprise CMOS switches.

32. The method according to claim 29, comprising impedance matching said balun to said integrated circuit via surface mount devices.

33. The method according to claim 32, wherein said surface mount devices are coupled to said multi-layer package.

34. The method according to claim 29, wherein said balun is electrically coupled to said antenna.

35. A system for wireless communication, the system comprising:
a multi-layer package bonded to an integrated circuit, wherein:
said multi-layer package comprises an integrated balun;
said integrated circuit bypasses said balun via bypass switches in said integrated circuit; and
said balun is enabled to process RF signals received from and/or communicated to an antenna.

36. The system according to claim 35, wherein said integrated circuit is flip-chip bonded to said multi-layer package.

37. The system according to claim 35, wherein said switches in said integrated circuit comprise CMOS switches.

38. The system according to claim 35, wherein said balun is impedance matched to said integrated circuit via surface mount devices.

39. The system according to claim 38, wherein said surface mount devices are coupled to said multi-layer package.

40. The system according to claim 35, wherein said balun is electrically coupled to said antenna.

41. A method for wireless communication, the method comprising:
in an integrated circuit, processing received RF signals by a balun integrated in a multi-layer package, wherein:
said integrated circuit is bonded to said multi-layer package;
said balun is enabled to process RF signals received from and/or communicated to an antenna; and
said balun is impedance matched to said integrated circuit via surface mount devices.

42. The method according to claim 41, wherein said integrated circuit is flip-chip bonded to said multi-layer package.

43. The method according to claim 41, comprising bypassing said balun utilizing MEMS switches integrated in said multi-layer package.

44. The method according to claim 41, comprising bypassing said balun via CMOS switches in said integrated circuit.

45. The method according to claim 41, wherein said surface mount devices are coupled to said multi-layer package.

46. The method according to claim 41, wherein said balun is electrically coupled to said antenna.

47. A system for wireless communication, the system comprising:
a multi-layer package bonded to an integrated circuit, wherein:
said multi-layer package comprises an integrated balun;
said balun is enabled to process RF signals received from and/or communicated to an antenna; and
said balun is impedance matched to said integrated circuit via surface mount devices.

48. The system according to claim 47, wherein said integrated circuit is flip-chip bonded to said multi-layer package.

49. The system according to claim 47, wherein said integrated circuit bypasses said balun via MEMS switches integrated in said multi-layer package.

50. The system according to claim 47, wherein said integrated circuit bypasses said balun via CMOS switches in said integrated circuit.

51. The system according to claim 47, wherein said surface mount devices are coupled to said multi-layer package.

52. The system according to claim 47, wherein said balun is electrically coupled to said antenna.

53. A method for wireless communication, the method comprising:
processing received RF signals in an integrated circuit coupled to a balun integrated in a multi-layer package, wherein:
said integrated circuit is bonded to said multi-layer package;
said balun is enabled to process RF signals received from and/or communicated to an antenna when said balun is not bypassed;
said balun comprises ferromagnetic layers integrated in said multi-layer package; and
said balun is bypassed via bypass switches in said integrated circuit.

54. The method according to claim 53, wherein said switches in said integrated circuit comprise CMOS switches.

55. The method according to claim 53, comprising impedance matching said balun to said integrated circuit via surface mount devices.

56. The method according to claim 55, wherein said surface mount devices are coupled to said multi-layer package.

57. The method according to claim 53, wherein said balun is electrically coupled to said antenna.

58. A method for wireless communication, the method comprising:
processing received RF signals in an integrated circuit coupled to a balun integrated in a multi-layer package and impedance matching said balun to said integrated circuit via surface mount devices, wherein:
said integrated circuit is bonded to said multi-layer package;
said balun is enabled to process RF signals received from and/or communicated to an antenna; and
said balun comprises ferromagnetic layers integrated in said multi-layer package.

59. The method according to claim 58, wherein said surface mount devices are coupled to said multi-layer package.

60. The method according to claim 58, wherein said balun is electrically coupled to said antenna.

61. A system for wireless communication, the system comprising:
a multi-layer package bonded to an integrated circuit, wherein:
said multi-layer package comprises an integrated balun;
said balun is enabled to process RF signals received from and/or communicated to an antenna;
said balun comprises ferromagnetic layers integrated in said multi-layer package; and
said integrated circuit is enabled to bypass said balun via bypass switches in said integrated circuit.

62. The system according to claim 61, wherein said switches in said integrated circuit comprise CMOS switches.

63. The system according to claim 61, wherein said balun is impedance matched to said integrated circuit via surface mount devices.

64. The system according to claim 63, wherein said surface mount devices are coupled to said multi-layer package.

65. The system according to claim 61, wherein said balun is electrically coupled to said antenna.

66. A system for wireless communication, the system comprising:
a multi-layer package bonded to an integrated circuit, wherein:
said multi-layer package comprises an integrated balun;
said balun is enabled to process RF signals received from and/or communicated to an antenna;
said balun comprises ferromagnetic layers integrated in said multi-layer package; and
said balun is impedance matched to said integrated circuit via surface mount devices.

67. The system according to claim 66, wherein said surface mount devices are coupled to said multi-layer package.

68. The system according to claim 66, wherein said balun is electrically coupled to said antenna.

* * * * *